(12) United States Patent
Baek et al.

(10) Patent No.: US 7,791,267 B2
(45) Date of Patent: Sep. 7, 2010

(54) ORGANIC LIGHT EMITTING DISPLAY AND METHOD OF FABRICATING THE SAME

(75) Inventors: Ji-Yeon Baek, Yongin-si (KR);
Won-Kyu Choe, Yongin-si (KR);
Keun-Soo Lee, Yongin-si (KR);
Dong-Young Sung, Yongin-si (KR)

(73) Assignee: Samsung Mobile Display Co., Ltd. (KR)

( * ) Notice: Subject to any disclaimer, the term of this patent is extended or adjusted under 35 U.S.C. 154(b) by 554 days.

(21) Appl. No.: 11/650,379

(22) Filed: Jan. 5, 2007

(65) Prior Publication Data

US 2008/0067932 A1 Mar. 20, 2008

(30) Foreign Application Priority Data

Sep. 15, 2006 (KR) .................... 10-2006-0089637

(51) Int. Cl.
*H01J 1/62* (2006.01)
(52) U.S. Cl. ............... 313/504; 313/506; 313/509; 445/24
(58) Field of Classification Search ......... 313/498–512; 445/24
See application file for complete search history.

(56) References Cited

U.S. PATENT DOCUMENTS

| | | | |
|---|---|---|---|
| 6,011,608 A | 1/2000 | Tanaka | |
| 6,157,127 A | 12/2000 | Hosokawa et al. | |
| 6,836,069 B2 | 12/2004 | Iga | |
| 6,836,301 B1 | 12/2004 | Kohtaka et al. | |
| 2002/0014628 A1 | 2/2002 | Koyama | |
| 2002/0101399 A1 | 8/2002 | Kubo et al. | |
| 2002/0102776 A1 | 8/2002 | Yamazaki et al. | |
| 2003/0128322 A1 | 7/2003 | Kurahashi et al. | |

(Continued)

FOREIGN PATENT DOCUMENTS

EP 1 369 924 12/2003

(Continued)

*Primary Examiner*—Bumsuk Won
(74) *Attorney, Agent, or Firm*—Knobbe Martens Olson & Bear LLP

(57) ABSTRACT

An organic light emitting display and a method of fabricating the same are disclosed. One embodiment of the organic light emitting display includes a substrate including a pixel region and a cathode-on-driver (COD) region adjacent to the pixel region, a thin film transistor formed on the pixel region of the substrate, and a planarization film formed on an entire surface of the substrate to cover the thin film transistor. The organic light emitting display also includes an organic light emitting diode including a first pixel electrode formed on the planarization film and connected to the thin film transistor, an organic light emitting layer formed on the first pixel electrode, and a second pixel electrode formed on an entire surface of the substrate over the organic light emitting layer. The organic light emitting display further includes a pixel definition layer which is provided between the planarization film and the second pixel electrode. The pixel definition layer has an opening where the organic light emitting layer is located. Openings are formed through the planarization film and the pixel definition layer to provide a recess for separating the pixel region and the COD region from each other. The organic light emitting display further includes a conductive layer partially filling the recess for reducing the depth of the recess.

16 Claims, 9 Drawing Sheets

U.S. PATENT DOCUMENTS

| | | |
|---|---|---|
| 2003/0137325 A1 | 7/2003 | Yamazaki et al. |
| 2003/0186489 A1 | 10/2003 | Ishikawa |
| 2003/0193056 A1 | 10/2003 | Takayama et al. |
| 2003/0205968 A1 | 11/2003 | Chae et al. |
| 2004/0012028 A1 | 1/2004 | Park et al. |
| 2004/0026740 A1 | 2/2004 | Kawasaki et al. |
| 2004/0108809 A1 | 6/2004 | Heo et al. |
| 2004/0171182 A1 | 9/2004 | Yamazaki et al. |
| 2004/0195959 A1 | 10/2004 | Park et al. |
| 2004/0219696 A1 | 11/2004 | Seo et al. |
| 2004/0224456 A1 | 11/2004 | Abe |
| 2004/0256620 A1* | 12/2004 | Yamazaki et al. ............. 257/66 |
| 2005/0078263 A1 | 4/2005 | Kim et al. |
| 2005/0231085 A1 | 10/2005 | Song et al. |

FOREIGN PATENT DOCUMENTS

| | | |
|---|---|---|
| JP | 2000-123978 | 4/2000 |
| JP | 2002-040431 A | 2/2002 |
| JP | 2002-324666 | 11/2002 |
| JP | 2002-333641 | 11/2002 |
| JP | 2002-367782 | 12/2002 |
| JP | 2003-021844 A | 1/2003 |
| JP | 2003-108029 | 4/2003 |
| JP | 2003-157971 | 5/2003 |
| JP | 2006-054111 | 2/2006 |
| KR | 10-2002-0089978 A | 11/2002 |
| KR | 10-2005-0051076 | 6/2005 |
| KR | 10-2006-0002668 | 1/2006 |

* cited by examiner

ORGANIC LIGHT EMITTING DISPLAY AND
METHOD OF FABRICATING THE SAME

CROSS-REFERENCE TO RELATED
APPLICATIONS

This application claims priority to and the benefit of Korean Patent Application No. 10-2006-0089637 filed in the Korean Intellectual Property Office on Sep. 15, 2006, the disclosure of which is incorporated herein by reference.

BACKGROUND

1. Field

The present disclosure relates to an organic light emitting display, and more particularly, to an organic light emitting display capable of preventing pixel driving failure and a method of fabricating the same.

2. Description of the Related Technology

An organic light emitting display is a self-luminescent device. In an organic light emitting display, electrons and holes are injected into an organic material through an anode and a cathode. The electrons and holes recombine with each other, and generate excitons. Light of a predetermined wavelength is generated by energy generated from the excitons. Since an organic light emitting display does not require a separate light source such as a backlight unit, it has advantages such as low power consumption, a wide viewing angle, and a fast response speed. Therefore, an organic light emitting display has drawn attention as a next generation display.

Organic light emitting display devices can be classified into a passive matrix type and an active matrix type. Recently, the active matrix type is widely used because of various advantages such as low power consumption, high definition, fast response, a wide viewing angle, and a thin profile. In such an active matrix type organic light emitting display device, a pixel region which displays images is formed on a substrate. A data driver and a scan driver for driving the pixel region are formed around the pixel region. In the pixel region, a plurality of pixels are arranged in a matrix form. Each pixel includes at least one organic light emitting diode. An organic light emitting diode may include first and second pixel electrodes, and an organic light emitting layer interposed between the pixel electrodes. An organic light emitting layer may have one of red, green, and blue colors.

SUMMARY OF CERTAIN INVENTIVE ASPECTS

One embodiment is an organic light emitting display device comprising: a substrate having a pixel region and a non-pixel region adjacent to the pixel region; a planarization layer formed over the substrate; a pixel definition layer formed over the planarization layer, the pixel definition layer overlying substantially the entire portion of the pixel region while at least partially overlying the non-pixel region, the pixel definition layer including an array of openings over the pixel region of the substrate; a plurality of organic light emitting diodes formed in the openings of the pixel definition layer, at least one of the organic light emitting diodes comprising a first pixel electrode formed over the planarization layer, a second pixel electrode overlying the first pixel electrode, and an organic light emitting layer interposed between the first and second pixel electrodes, the second pixel electrode further comprising a portion extending over the non-pixel region; an elongate recess formed through the planarization layer and the pixel definition layer at or near the junction of the pixel region and the non-pixel region; and a first dummy pattern partially filling the elongate recess so as to reduce the depth of the recess.

The device may further comprise at least one of a scan driver and a data driver formed over the non-pixel region of the substrate, wherein the portion of the second pixel electrode extends over the driver. The device may further comprise a thin film transistor (TFT) formed over the pixel region of the substrate, the TFT being interposed between the planarization layer and the substrate, the TFT comprising source and drain electrodes, wherein the first dummy pattern is formed of the same material as that of the source and drain electrodes.

The device may further comprise a first insulation layer formed over the substrate, wherein the planarization layer is formed on the first insulation layer, and wherein the first dummy pattern is formed on the first insulation layer. The device may further comprise: a second insulation layer interposed between the first insulation layer and the substrate; and a second dummy pattern interposed between the first insulation layer and the second insulation layer, the second dummy pattern substantially overlapping with the first dummy pattern. The TFT may further comprise a gate electrode interposed between the first and second insulation layers, and the second dummy pattern may be formed of the same material as that of the gate electrode.

The device may further comprise a third dummy pattern formed on the first dummy pattern in the elongate recess so as to further reduce the depth of the recess. The third dummy pattern may be formed of the same material as that of the first pixel electrode. The portion of the second pixel electrode may include a section that is formed in the elongate recess. The section may contact the first dummy pattern. The device may further comprise a third dummy pattern formed on the first dummy pattern in the elongate recess so as to further reduce the depth of the recess, wherein the section contacts the third dummy pattern.

Another embodiment is a method of fabricating an organic light emitting display. The method comprises providing a substrate including a pixel region and a non-pixel region adjacent to the pixel region; forming a planarization layer over the substrate; forming a first elongate recess in the planarization layer at or near the junction of the pixel region and the non-pixel region such that the first elongate recess extends at least partially along one edge of the pixel region; forming a pixel definition layer over the planarization layer such that the pixel definition layer overlies substantially the entire portion of the pixel region while at least partially overlying the non-pixel region; forming a second elongate recess in the pixel definition layer over the first elongate recess so as to open the first elongate recess; and forming a first dummy pattern, the first dummy pattern being configured to reduce the total depth of the first and second elongate recesses.

The first dummy pattern may be formed over the substrate prior to forming the planarization layer. The method may further comprise forming a first insulation layer over the substrate prior to forming the planarization layer, wherein the first dummy pattern is formed on the first insulation layer; wherein the planarization layer is formed on the first insulation layer such that the first dummy pattern is buried under the planarization layer; and wherein the first elongate recess is formed to at least partially expose the first dummy pattern.

The method may further comprise, prior to forming the planarization layer, forming a thin film transistor comprising source and drain electrodes over the pixel region of the substrates such that portions of the source and drain electrodes are interposed between the first insulation layer and the planarization layer, wherein the first dummy pattern is simultaneously formed with the source and drain electrodes. The method may further comprise, prior to forming the first insulation layer: forming a second insulation layer over the substrate; and forming a second dummy pattern on the second insulation layer, wherein the first insulation layer is formed over the second insulation layer such that the second dummy pattern is buried under the first insulation layer, and wherein the first dummy pattern substantially overlaps with the second dummy pattern when viewed from over the first dummy pattern.

Forming the thin film transistor may comprise forming a gate electrode on the second insulation layer prior to forming the first insulation layer, and the second dummy pattern may be formed simultaneously with the gate electrode. The method may further comprise forming a third dummy pattern on the first dummy pattern in the first elongate recess so as to further reduce the total depth of the first and second elongate recesses. The method may further comprise forming a first pixel electrode on the planarization layer prior to forming the pixel definition layer, wherein the third dummy pattern is simultaneously formed with the first pixel electrode.

The method may further comprise: forming an array of openings in the pixel definition layer simultaneously with forming the second elongate recess; forming an organic light emitting layer in the openings; and forming a second pixel electrode over the pixel definition layer and the organic light emitting layer such that the second pixel electrode extends from over the organic light emitting layer to over the non-pixel region, and such that the second pixel electrode includes a portion that is formed in the first and second elongate recesses.

Another embodiment is an organic light emitting display comprising a substrate including a pixel region and a cathode-on-driver (COD) region adjacent to the pixel region, a thin film transistor formed on the pixel region of the substrate, a planarization film formed on an entire surface of the substrate to cover the thin film transistor, an organic light emitting diode including a first pixel electrode formed on the planarization film and connected to the thin film transistor, an organic light emitting layer formed on the first pixel electrode, and a second pixel electrode formed on an entire surface of the substrate over the organic light emitting layer, and a pixel definition layer which is provided between the planarization film and the second pixel electrode and has an opening where the organic light emitting layer is located. Openings passed through each other are formed in the planarization film and the pixel definition layer to provide a recess for separating the pixel region and the COD region from each other. The organic light emitting display further comprises a dummy pattern provided in the recess for reducing a depth of the recess.

In this embodiment, the thin film transistor may include an active layer and a gate electrode sequentially formed by interposing a gate insulation film, and source and drain electrodes disposed over the gate electrode interposing an intermediate insulation film. The dummy pattern may be formed of the same material as that of the source and drain electrodes and is formed on the intermediate insulation film.

The dummy pattern may include a first dummy pattern formed of the same material as that of the source and drain electrodes, and a second dummy pattern which is disposed under the first dummy pattern and formed of the same material as that of the gate electrode. The first dummy pattern may be formed on the intermediate insulation film, and the second dummy pattern is formed on the gate insulation film.

Alternatively, the dummy pattern may include a first dummy pattern formed of the same material as that of the source and drain electrodes, and a second dummy pattern which is disposed on the first dummy pattern and formed of the same material as that of the first pixel electrode. The first dummy pattern may be formed on the interlayer insulation film.

Alternatively, the dummy pattern may include a first dummy pattern formed of the same material as that of the source and drain electrodes, a second dummy pattern which is disposed below the first dummy pattern and formed of the same material as that of the gate electrode, and a third dummy pattern which is disposed on the first dummy pattern and formed of the same material as that of the first pixel electrode. The first dummy pattern may be formed on the interlayer insulation film, and the second dummy pattern is formed on the gate insulation film. The planarization film may be formed of acryl. The second pixel electrode may have a thickness of about 100 to about 180 Å.

Another embodiment is a method of fabricating an organic light emitting display. The method comprises providing a substrate including a pixel region and a cathode-on-driver (COD) region adjacent to the pixel region, forming a thin film transistor on the pixel region of the substrate, forming a planarization film on an entire surface of the substrate to cover the thin film transistor, forming a via hole for exposing a part of the thin film transistor in the planarization film and an opening for exposing an area between the pixel region and the COD region, forming a first pixel electrode connected to the thin film transistor through the via hole on the planarization film, forming a pixel definition layer on the planarization film to cover the first pixel electrode, forming an opening for exposing the first pixel electrode in the pixel definition film as well as an opening passing through the opening of the planarization film to provide a recess for separating the pixel region and the COD region from each other, forming an organic light emitting layer on the first pixel electrode and forming a second pixel electrode on an entire surface of the substrate over the organic light emitting layer. A first dummy pattern exposed by the recess is formed between the pixel region and the COD region when the thin film transistor is formed.

In this embodiment, forming the thin film transistor may include sequentially forming an active layer, a gate insulation film, and a gate electrode on the substrate, forming an intermediate insulation film on the gate insulation film to cover the gate electrode, and forming source and drain electrodes on the interlayer insulation film.

The first dummy pattern may be simultaneously formed when the source and drain electrodes are formed. Alternatively, a second dummy pattern disposed below the first dummy pattern may be simultaneously formed when the gate electrode is formed. Alternatively, a second dummy pattern disposed on the first dummy pattern simultaneously may be formed when the first pixel electrode is formed.

Alternatively, a second dummy pattern disposed below the first dummy pattern may be simultaneously formed when the gate electrode is formed, and a third dummy pattern disposed on the first dummy pattern may be simultaneously formed when the first pixel electrode is formed. The flattening film is formed of acryl. The second pixel electrode has a thickness of about 100 to about 180 Å.

DETAILED DESCRIPTION OF CERTAIN INVENTIVE EMBODIMENTS

Hereinafter, exemplary embodiments will be described in detail with reference to the attached drawings such that the invention can be easily put into practice by those skilled in the art. The invention may be embodied and modified in a variety of forms, and the embodiments are not intended to limit the disclosure.

Embodiments of an organic light emitting display that are capable of preventing pixel driving failure are disclosed. A method of fabricating the organic light emitting display is also disclosed.

An organic light emitting display includes a substrate which has a pixel region and a non-pixel region. The display also includes an array of pixels formed in the pixel region of the substrate. Each of the pixels includes at least one organic light emitting diode (OLED). The OLED includes a first pixel electrode, a second pixel electrode overlying the first pixel electrodes, and an organic light emitting layer interposed between the first and second pixel electrodes. The display also includes a scan driver and a data driver for driving the pixels. The drivers are formed in the non-pixel region of the substrate.

Each of the pixels includes a thin film transistor (TFT) connected to the organic light emitting diode. A planarization film may be interposed between the organic light emitting diode and the TFT.

The second pixel electrode of the organic light emitting diode may be formed continuously over substantially the entire surface of the substrate. The second pixel electrode is configured to provide a voltage to a plurality of pixels in the pixel region. In such an arrangement, the display also includes a cathode-on-driver (COD) region, in which the second pixel electrode covers the scan driver or the data driver.

The planarization film interposed between the organic light emitting diode and the thin film transistor is typically formed of acrylic material. Therefore, the planarization film may shrink in subsequent processes such as a process of forming the organic light emitting diode. As a result, the first pixel electrode may be accidentally connected to the scan driver or the data driver in the COD area. Such connection between the pixel region and the COD region may cause pixel failure, and finally degrade the display quality of the organic light emitting display.

Figure 1:
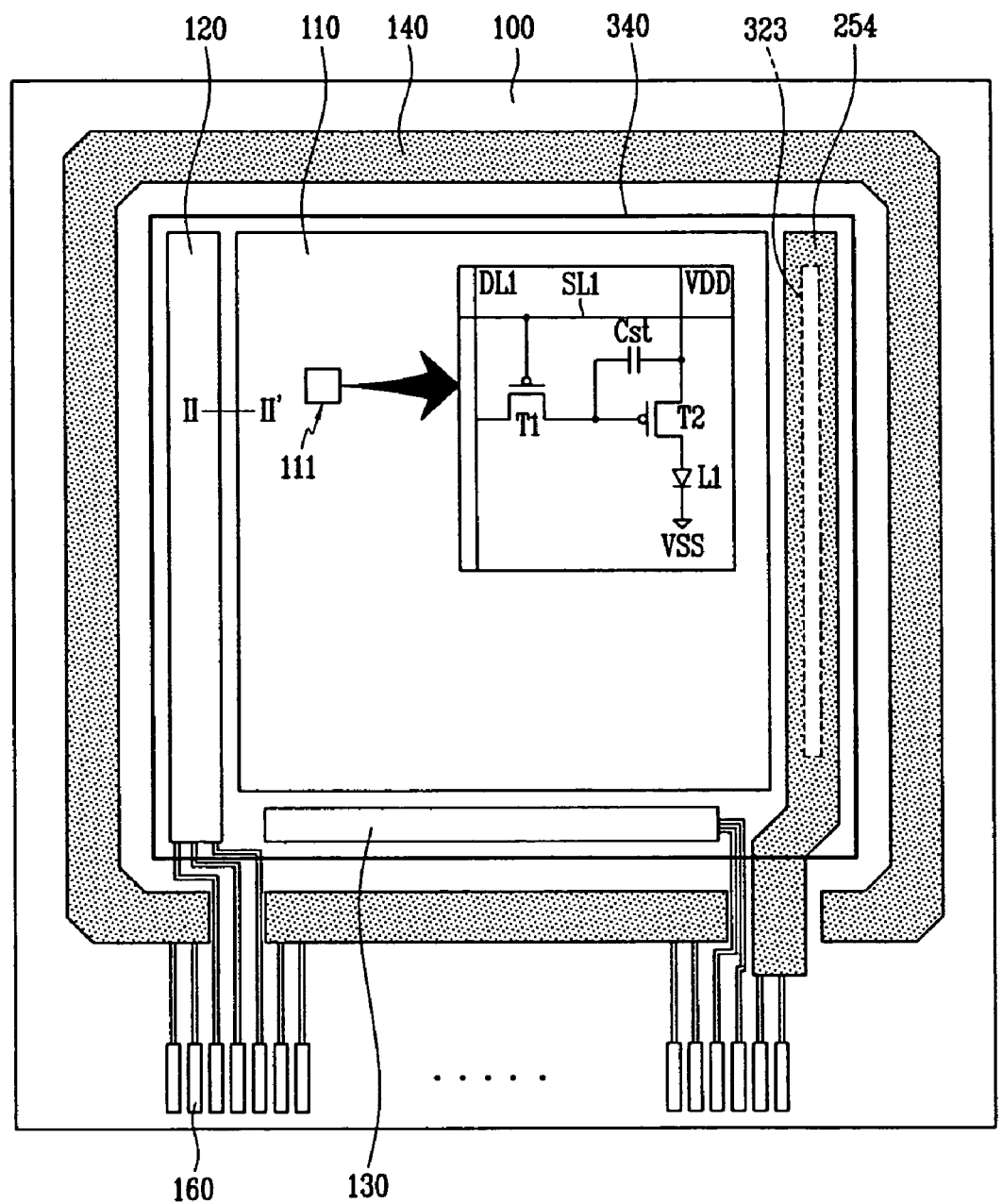
FIG. 1 is a top plan view illustrating an organic light emitting display according to a first embodiment.

Now, an organic light emitting display according to an embodiment will be described with reference to FIGS. 1 and 2. Referring to FIG. 1, a pixel region 110 which displays an image is formed on a substrate 100. A plurality of pixels 111 are arranged in a matrix form in the pixel region 110. A scan driver 120, a data driver 130, a power line, and a second pixel electrode wire line 254 are formed around the pixel region 110. The scan driver 120 and the data driver 130 are configured to drive the pixels 111 in response to signals input from a pad unit 160. The power line is configured to supply power to the pixels 111 in the pixel region 110. The second pixel electrode wire line 254 is configured to supply a negative voltage to a second pixel electrode 340 of the pixel region 110. The second pixel electrode 340 makes contact with the second pixel electrode wire line 254 through a via hole 323. The second pixel electrode 340 may be formed on substantially the entire surface of the substrate 100.

In one embodiment, each of the pixels 111 may include a first thin film transistor (TFT) T1 for switching, a second thin film transistor T2 for driving, a storage capacitor Cst, and an organic light emitting diode L1.

The first TFT T1 is connected to a scan line SL1 and a data line DL1 to transmit a data voltage input from the data line DL1 to the second TFT T2 on the basis of a switching voltage input from the scan line SL1. The storage capacitor Cst is connected to the first TFT T1 and a power line VDD to store a voltage difference $V_{gs}$ between a voltage supplied from the first TFT T1 and a voltage supplied to the power line VDD.

The second TFT T2 is connected to the power line VDD and the storage capacitor Cst to supply a squared difference between the voltage $V_{gs}$ stored in the storage capacitor Cst and a threshold voltage $V_{th}$ to the organic light emitting diode L1, so that the organic light emitting diode L1 can emit light based on an output current $I_d$. In this case, the output current $I_d$ can be expressed as follows:

$$I_d = (\beta/2) \times (V_{gs} - V_{th})^2, \quad \text{Equation 1}$$

where β is a proportional factor.

Now, the organic light emitting diode L1 of the pixel 111 and the second TFT T2 connected thereto will be described in more detail with reference to FIG. 2.

A buffer layer 200 is formed over the substrate 100. An active semiconductor layer 210 including source and drain regions 211 and 212 and a channel region 213 therebetween are formed over the buffer layer 200. A gate insulation film 220 is formed over the buffer layer 200 to cover the active layer 210. A gate electrode 230 is formed on the gate insulation film 220 over the active layer 210. An intermediate insulation film 240 is formed on the gate insulation film 220 to cover the gate electrode 230. Source and drains electrodes 251 and 252 are formed on the intermediate insulation film 240. They are electrically connected to the source and drain regions 211 and 212 through a first contact holes 221 and 241 and second contact holes 222 and 242 formed through the intermediate insulation film 240 and the gate insulation film 220.

In one embodiment, the substrate 100 may be formed of an insulation material or a metallic material. The insulation material may be glass or a plastic material. The metallic material may be stainless steel. The buffer layer 200 is configured to prevent impurities from diffusing into the substrate 100 during formation of the active layer 210. The buffer layer 200 may have a single silicon nitride (SiN) layer or a stacked structure including a silicon nitride (SiN) layer and a silicon oxide ($SiO_2$) layer. The gate electrode 230 may be formed of a metal layer. The metallic layer may be one of a MoW film, an Al film, a Cr film, and Al/Cr film. The source and drain electrodes 251 and 252 may include a metallic layer, such as a T1/Al film and a T1/Al/T1 film.

A planarization film 260 is formed over the intermediate insulation film 160 to cover the second TFT T2. A first pixel electrode 310 is formed on the planarization film 260. The drain electrode 252 of the second TFT T2 is electrically connected to the first electrode 310 through a via hole 261 provided in the planarization film 260. Then, an organic light emitting layer 330 and a second pixel electrode 340 are sequentially stacked on the first pixel electrode 310, forming the organic light emitting diode L1.

The first pixel electrode 310 is electrically separated from the first pixel electrode (not shown) of an adjacent pixel by the pixel definition layer 320. The first pixel electrode 310 makes contact with the organic light emitting layer 330 through an opening 321 of the pixel definition layer 320. The second pixel electrode 340 is formed on substantially the entire surface of the substrate, as shown in FIG. 1 to commonly provide a negative voltage to the plurality of pixels 111 arranged in the pixel region 110.

In one embodiment, a first dummy pattern 253 may be formed on the intermediate insulation film 240 between the pixel region and a cathode-on-driver (COD) region. The COD region includes the scan driver 120 and the data driver 130. The second pixel electrode 340 may extend over the scan driver 120 or the data driver 130 in the COD region. The first dummy pattern 253 may be formed of the same material as that of the source and drain electrodes 251 and 252. Openings 262 and 322 are formed through the planarization film 260 and the pixel definition layer 320. The openings 262, 322 form an elongated recess 400 and expose the first dummy pattern 253. The pixel region 110 and the COD region COD are separated from each other by the recess 400. The second pixel electrode 340 extends on and across the recess 400.

In one embodiment, the planarization film 260 may be formed of an acrylic film. The planarization film 260 may have a thickness of about 1.3 µm to about 1.5 µm. Also, the pixel definition layer 320 may have a thickness of about 1.0 µm to about 1.3 µm. The first pixel electrode 310 serves to inject holes, while the second pixel electrode 340 serves to inject electrons.

The first pixel electrode 310 may be a first transparent electrode formed of indium tin oxide (ITO) or indium zinc oxide (IZO). The first pixel electrode 310 may further include a conductive reflection film and a second transparent film formed on the first transparent electrode, depending on the light emitting direction of the organic light emitting diode L1. The reflection film reflects light from the organic light emitting layer 330 to improve illumination efficiency and electrical conductivity. The reflection film may be formed of Al, Al-alloy, Ag, Ag-alloy, Au, or Au-alloy. The second transparent electrode is configured to prevent oxidation of the reflection film and to improve a work function relationship between the organic light emitting layer 330 and the reflection film. The second transparent electrode may be formed of ITO or IZO.

The organic light emitting layer 330 may further include a light emitting layer configured to emit light. The organic light emitting layer 330 may also include other organic layers stacked over or under the light emitting layer in order to effectively transmitting carriers such as holes or electrons to the light emitting layer. For example, the organic layer may include at least one of a hole injection layer, an hole transport layer, an electron transport layer, and an electron injection layer. The hole injection layer and the hole transport layer may be provided between the light emitting layer and the first pixel electrode 310. The electron transport layer and the electron injection layer may be provided between the light emitting layer and the second pixel electrode 340.

The second pixel electrode 340 may be formed of a transparent conductive film or an opaque conductive film, depending on the light emitting direction of the light emitting device L1. The transparent conductive film may have a thickness of about 100 to about 180 Å. In addition, the transparent conductive film may be formed of IZO, ITO, or MgAg. The opaque conductive film may be formed of Al.

According to the aforementioned embodiment, the COD region and the pixel region 110 are separated from each other by the recess 400. Therefore, even when there is film shrinkage in the planarization film 260 or the pixel definition layer 320, the recess 400 can prevent electrical connection between the scan driver 120 or the data driver 130 in the COD region and the first pixel electrode 310 in the pixel region 110.

In addition, the first dummy pattern 253 is configured to reduce the depth of the recess 400. Thus, the second pixel electrode 340 can be formed on the recess 400 without any disconnection even when the second pixel electrode 340 has a thin thickness. Therefore, this configuration prevents pixel driving failure and improves display quality in the organic light emitting display.

Although the first dummy pattern 253 formed of the same material as that of the source and drain electrodes 251 and 252 is provided on the bottom of the recess 400 in the aforementioned embodiment, another dummy pattern may be further included in the recess 400 to further reduce the depth of the recess 400.

Figure 3:
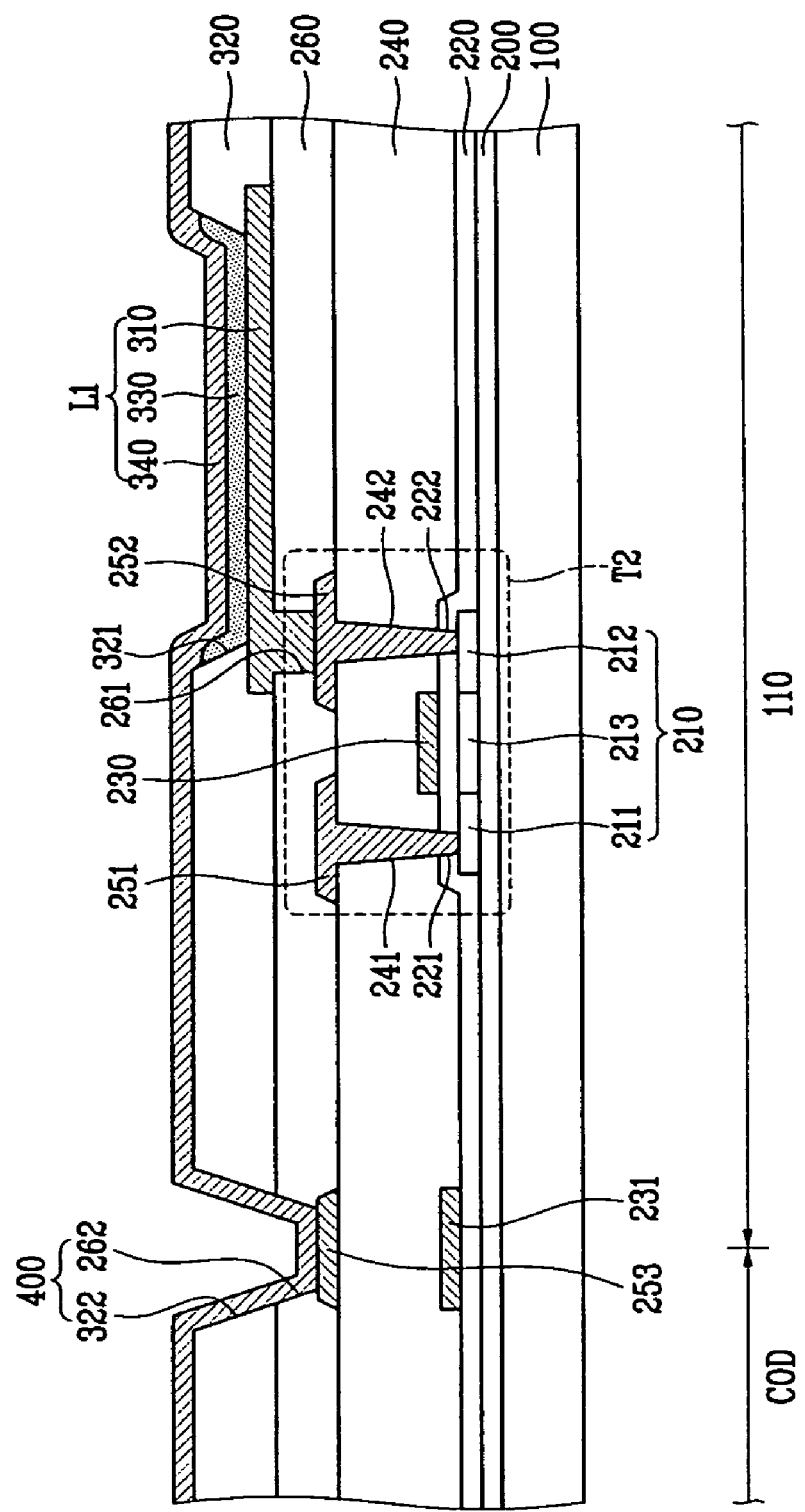
FIG. 3 is a partial cross-sectional view of an organic light emitting display according to a second embodiment.
Figure 4:
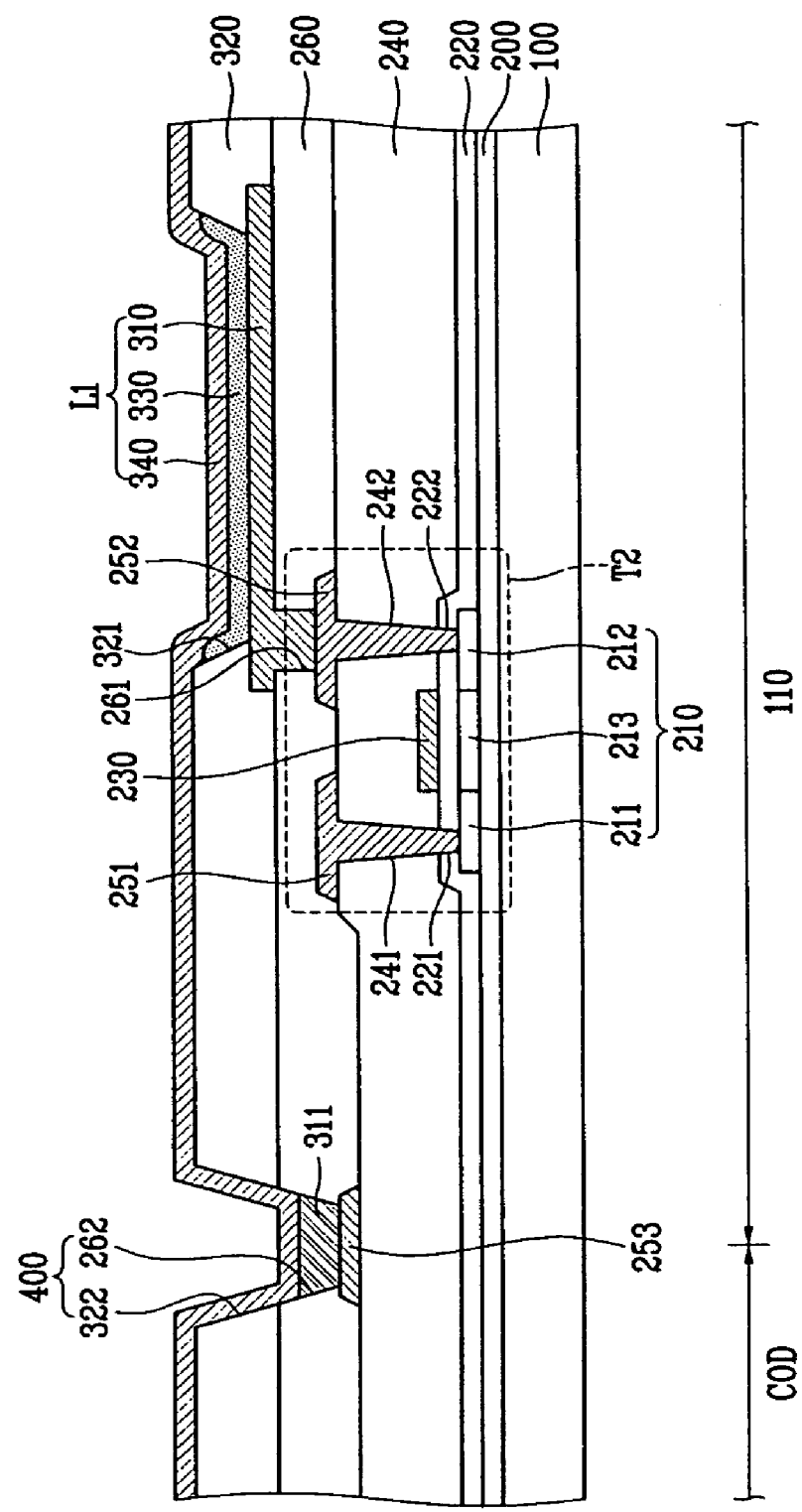
FIG. 4 is a partial cross-sectional view of an organic light emitting display according to a third embodiment.
Figure 5:
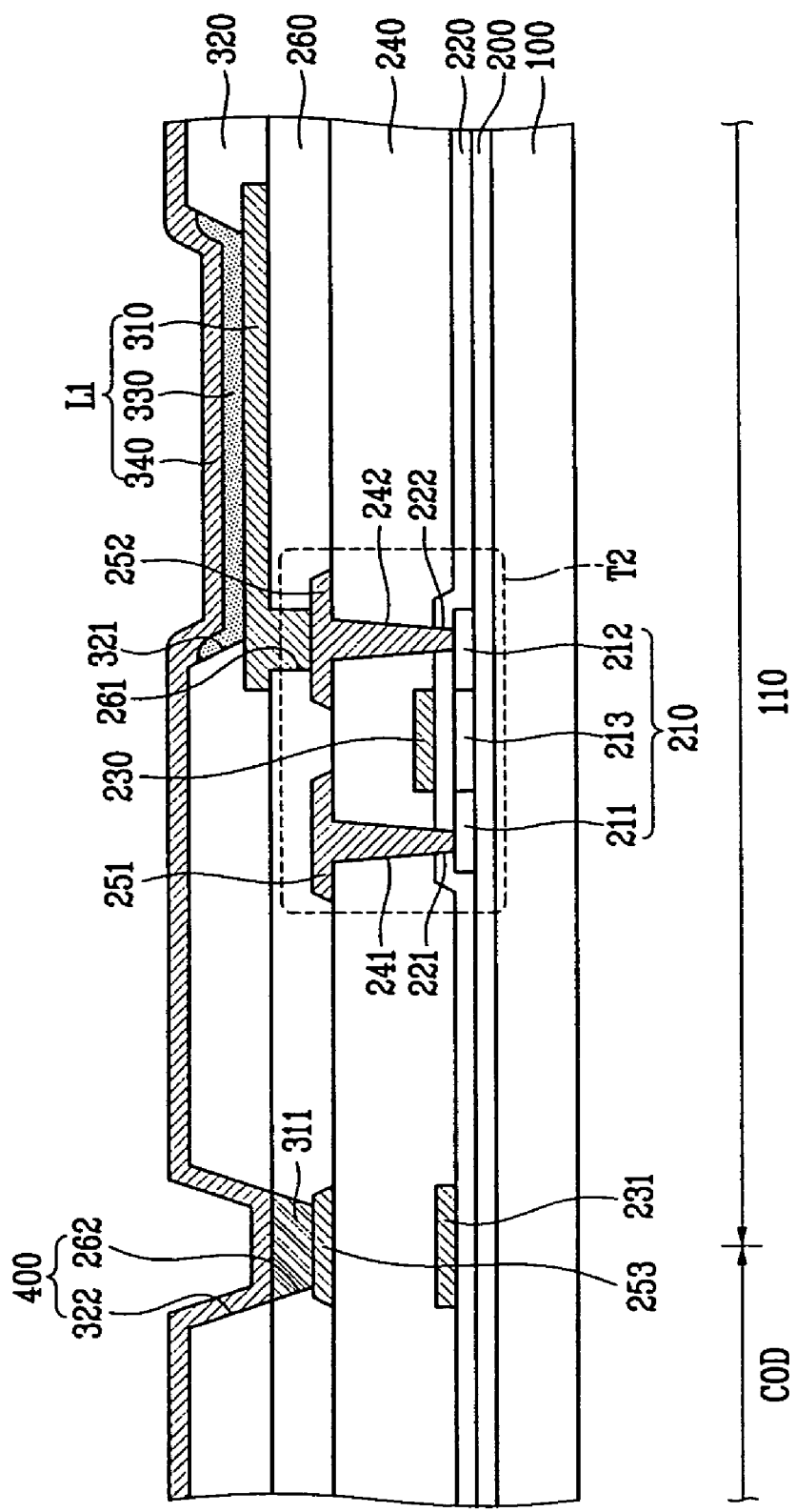
FIG. 5 is a partial cross-sectional view of an organic light emitting display according to a fourth embodiment.

For example, as shown in FIG. 3, a second dummy pattern 231 formed of the same material as that of the gate electrode 230 may be provided on the gate insulation film 220 below the first dummy pattern 253. Alternatively, as shown in FIG. 4, a third dummy pattern 311 formed of the same material as that of the first pixel electrode 310 may be provided on the first dummy pattern 253. Alternatively, as shown in FIG. 5, both the second and third dummy patterns 231 and 311 may be formed on and below the first dummy pattern 311, respectively.

Figure 6A:
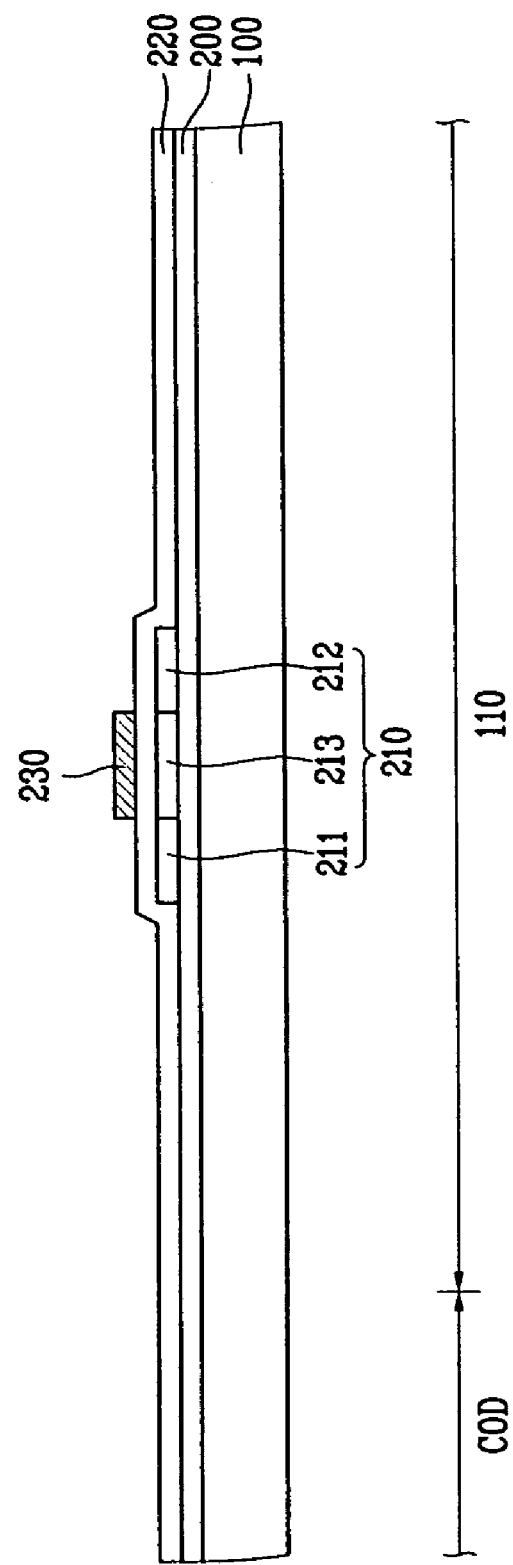
FIGS. 6A to 6D illustrate a method of fabricating an organic light emitting display according to one embodiment.

Now, a method of fabricating an organic light emitting display will be described in more detail with reference to FIGS. 6A to 6D. Referring to FIG. 6A, a buffer layer 200 formed of a silicon nitride layer (SiN) or a stack structure including a silicon nitride layer and a silicon oxide layer ($SiO_2$) is formed on a substrate 100. The substrate 100 includes a pixel region 110 and a neighboring COD region labeled COD. Then, an amorphous silicon film is deposited and crystallized on the buffer layer 200 and then is patterned to form an active semiconductor layer 210 on the pixel region 110. Subsequently, a gate insulation film 220 is formed on the buffer layer 200 to cover the active layer 210. A metallic layer formed of one of MoW, Al, Cr, and Al/Cr alloy is formed on the gate insulation film 220, and then is patterned to form a gate electrode 230 on the gate insulation film 220 over the active layer 210. Subsequently, impurities are doped into both sides of the active layer 210 to form source and drain regions 211 and 212.

Figure 6B:
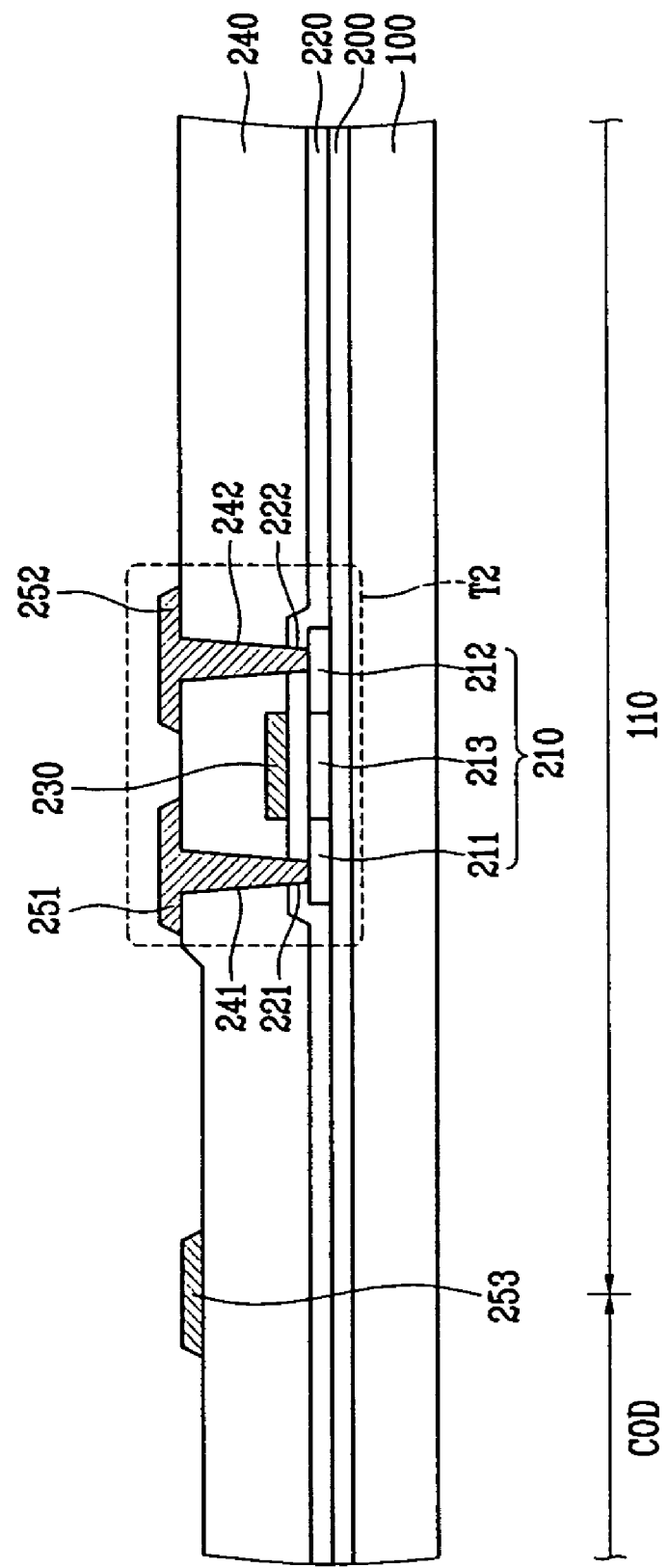

Referring to FIG. 6B, an intermediate insulation film 240 is formed on the gate insulation film 230 to cover the gate electrode 230. The intermediate insulation film 240 and the gate insulation film 220 are patterned to form first contact holes 221 and 241 for exposing the source region 211 and second contact holes 222 and 242 for exposing the drain region 212. Then, a metallic layer formed of, for example, a T1/Al film or a T1/Al/T1 film is deposited on the intermediate insulation film 240 and the first and second contact holes 221, 241, 222, and 242. The metallic layer is then patterned to provide source and drain electrodes 251 and 252 electrically connected to the source and drain regions 211 and 212. Simultaneously, the first dummy pattern 252 may be formed on the intermediate insulation film 240 between the pixel region 110 and the COD region.

Figure 6C:
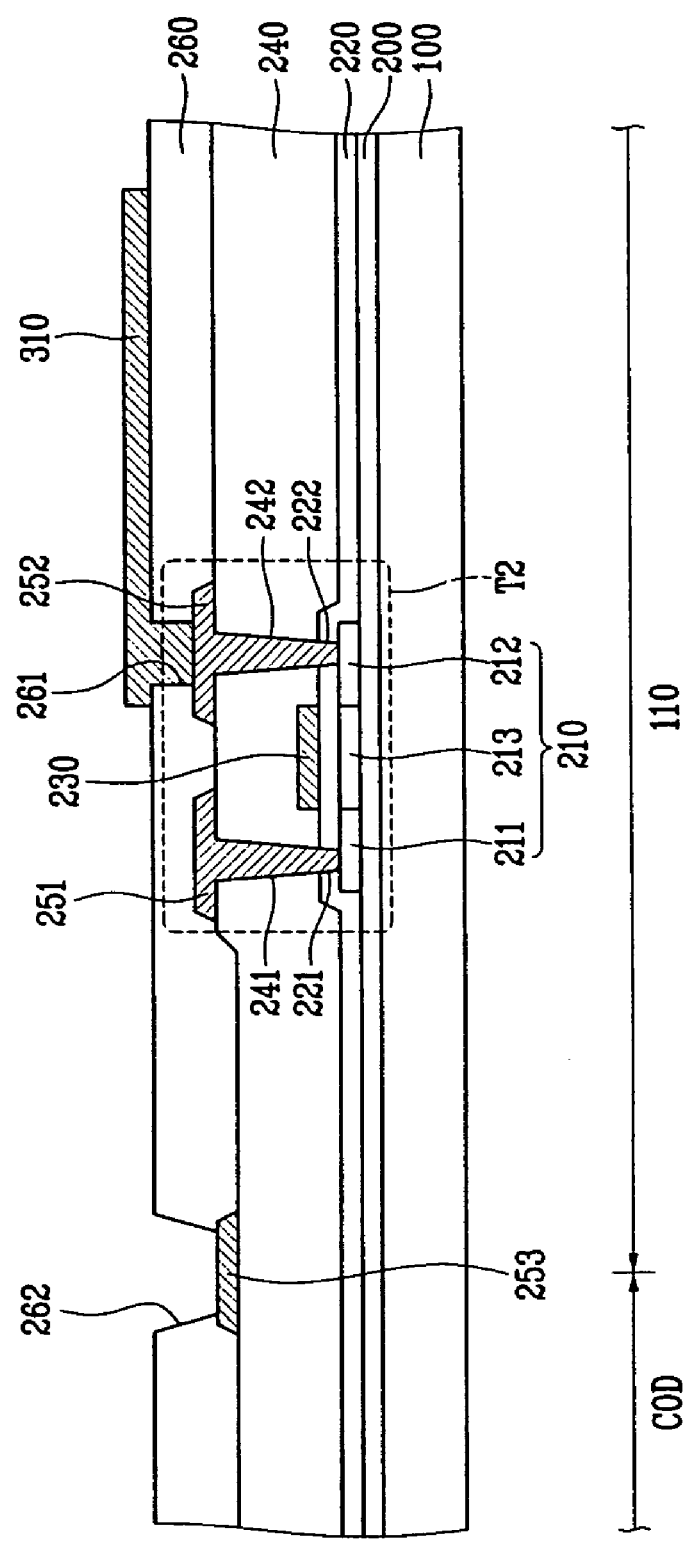

Referring to FIG. 6C, a planarization film 260 formed of acryl is provided on the intermediate insulation film 240 to cover the second TFT T2 and the first dummy pattern 253. Then, the planarization film 260 is patterned to form a via hole 261 for exposing the drain electrode 252 of the second TFT T2 as well as an opening 262 for exposing the first dummy pattern 253. Then, the first pixel electrode material film is deposited on the planarization film 260 and the via hole 261, and is patterned using an etching process to form the first pixel electrode 310 electrically connected to the drain electrode 252.

Figure 6D:
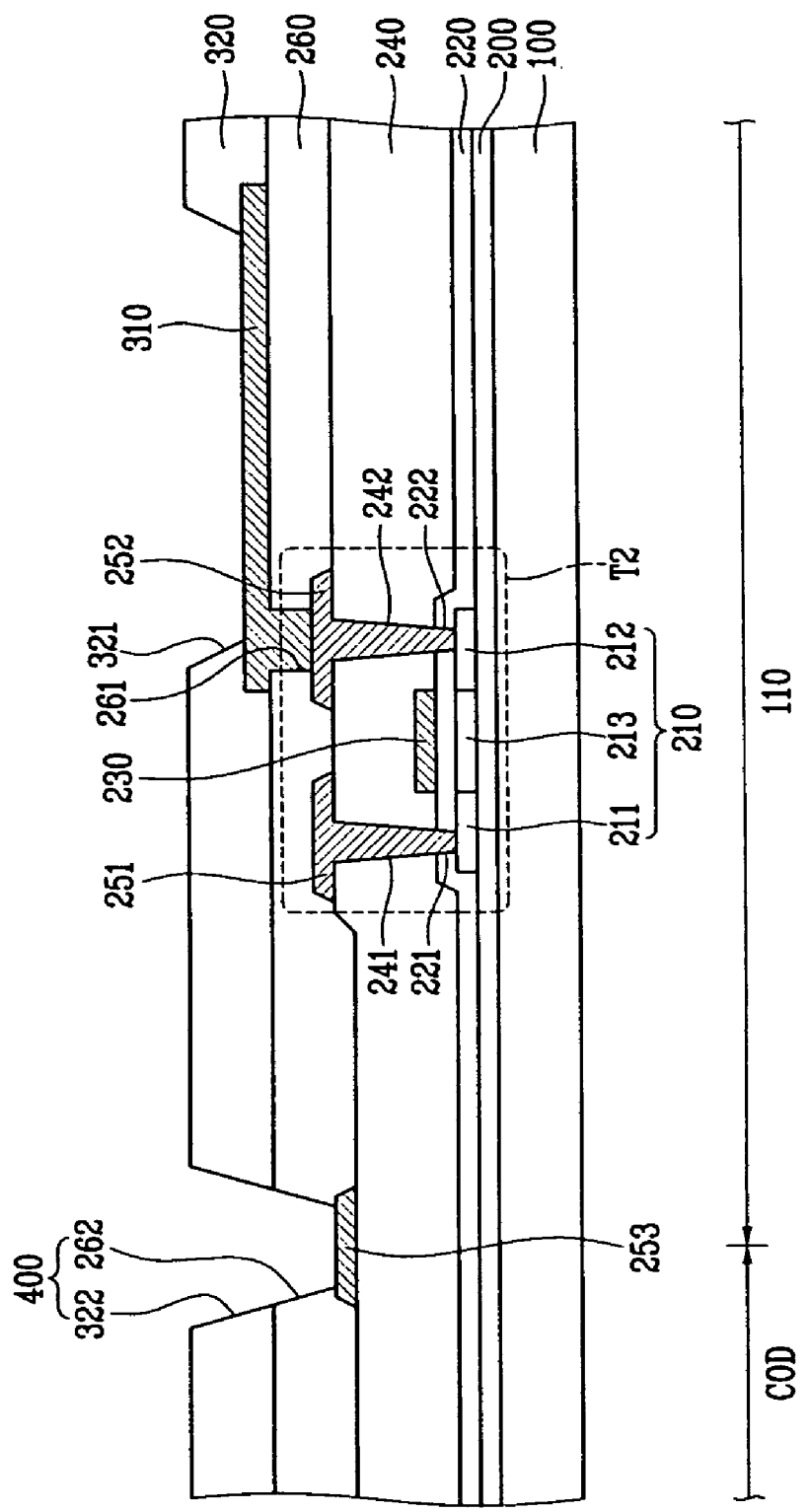

Referring to FIG. 6D, a pixel definition layer 320 is formed on the planarization film 260 to cover the first pixel electrode 340. Then, the pixel definition layer 320 is patterned to form an opening 321 for exposing the first pixel electrode 310. During this process, another opening 322 is also formed between the pixel region 110 and the COD region. The opening 322 is configured to expose the opening 262 of the planarization film 260, forming an elongated recess or groove 400. This configuration separates the pixel region 110 and the COD region COD from each other.

Figure 2:
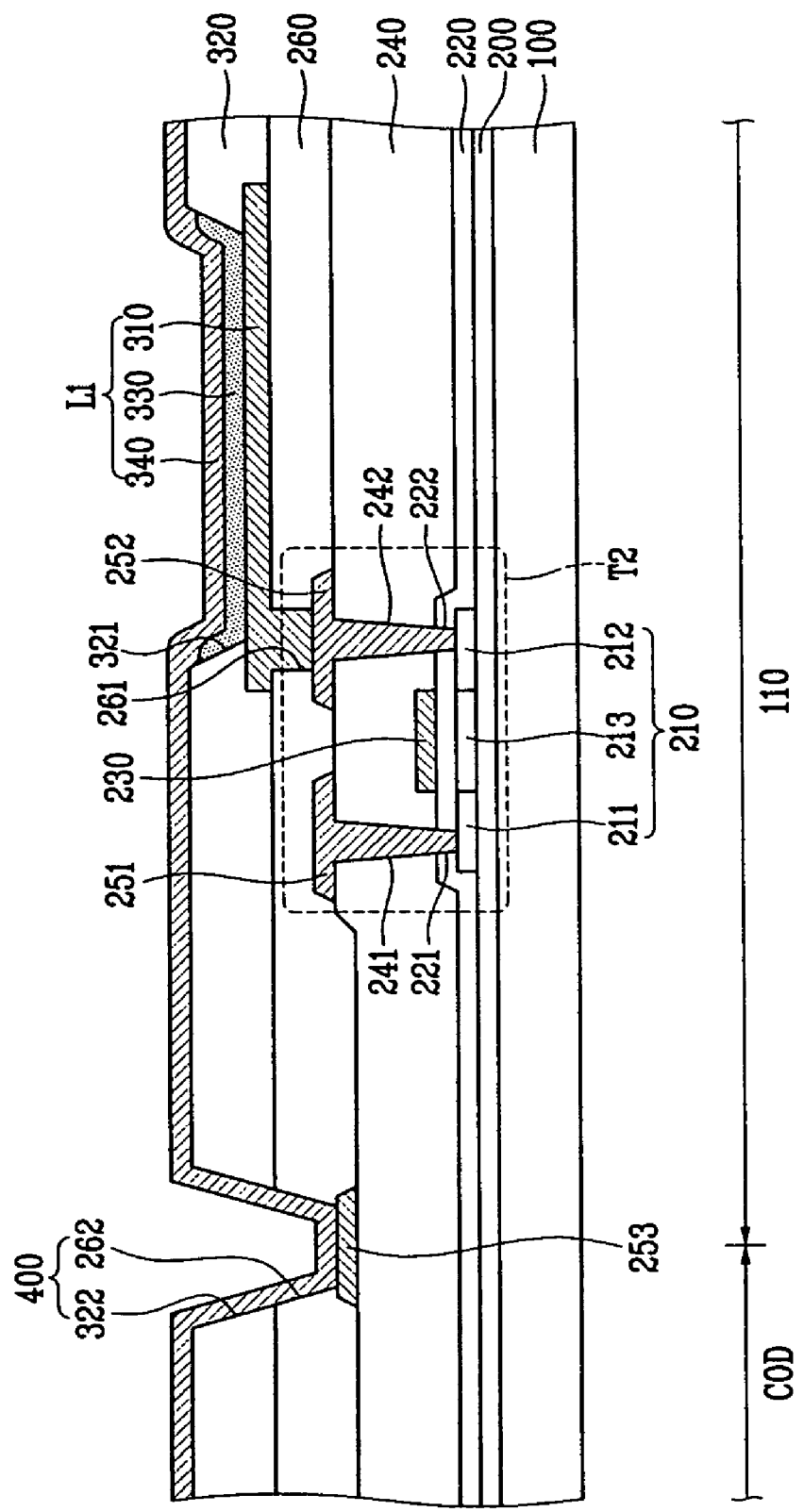
FIG. 2 is a cross-sectional view of the organic light emitting display according to the first embodiment, taken along the line II-II' of FIG. 1.

Subsequently, the organic light emitting layer 330 is formed on the first pixel electrode 310 (FIG. 2). The second pixel electrode 340 is formed on substantially the entire surface of the substrate 100.

In the embodiments described above, the pixel region 110 and the COD region COD are separated from each other by the recess 400 even when the planarization film 260 shrinks. Therefore, it is possible to prevent unnecessary connection between the pixel region 110 and the COD region COD. In addition, since the first dummy pattern 253 is provided at the bottom of the recess 400 to reduce the depth of the recess 400, it is possible to prevent disconnection of the second pixel electrode 340.

Furthermore, the recess 400 between the pixel region 110 and the COD region is simultaneously formed when the planarization film and the pixel definition layer 320 are patterned. The first dummy pattern 253 is also simultaneously formed when the source and drain electrodes 251 and 252 are formed. Therefore, any process burden is not increased.

Although the first dummy pattern 253 is simultaneously formed in the recess 400 when the source and drain electrodes 251 and 252 are formed in the aforementioned embodiments, the second dummy pattern 231 may be further formed on the gate insulation film 220 below the first dummy pattern 253 when the gate electrode 230 is formed as shown in FIG. 3.

In addition, the third dummy pattern 311 may be further formed on the first dummy pattern 253 when the first pixel electrode 310 is formed as shown in FIG. 4. Furthermore, both the second and third dummy patterns 231 and 311 may be provided on and below the first dummy pattern 253 as shown in FIG. 5 when the gate electrode 230 and the first pixel electrode 310 are formed.

Although the exemplary embodiments and the modified examples of the invention have been described, the invention is not limited to the embodiments and examples, but may be modified in various forms without departing from the scope of the appended claims, the detailed description, and the accompanying drawings of the present application.

What is claimed is:

1. An organic light emitting display device comprising:
 a substrate having a pixel region and a non-pixel region adjacent to the pixel region;
 a planarization layer formed over the substrate;
 a pixel definition structure formed over the planarization layer, the pixel definition structure overlying substantially the entire portion of the pixel region, the pixel definition structure including an array of openings over the pixel region of the substrate;
 a plurality of organic light emitting diodes formed in the openings of the pixel definition structure, at least one of the organic light emitting diodes comprising a first pixel electrode formed over the planarization layer, a second pixel electrode overlying the first pixel electrode, and an organic light emitting layer interposed between the first and second pixel electrodes, the second pixel electrode further comprising a portion extending over the non-pixel region;
 an elongate recess formed through the planarization layer and the pixel definition structure at or near the junction of the pixel region and the non-pixel region, wherein the portion of the second pixel electrode includes a section that is formed in the elongate recess;
 a first dummy pattern formed under the section of the portion of the second pixel electrode;
 a thin film transistor (TFT) formed over the pixel region of the substrate, the TFT being interposed between the planarization layer and the substrate, the TFT comprising source and drain electrodes, wherein the first dummy pattern is formed of the same material as that of the source and drain electrodes;
 a first insulation layer formed over the substrate, wherein the planarization layer is formed on the first insulation layer, and wherein the first dummy pattern is formed on the first insulation layer;
 a second insulation layer interposed between the first insulation layer and the substrate; and
 a second dummy pattern interposed between the first insulation layer and the second insulation layer, the second dummy pattern substantially overlapping with the first dummy pattern.

2. The device of claim 1, further comprising at least one of a scan driver and a data driver formed over the non-pixel region of the substrate, wherein the portion of the second pixel electrode extends over the scan driver or the data driver.

3. The device of claim 1, wherein the TFT further comprises a gate electrode interposed between the first and second insulation layers, and wherein the second dummy pattern is formed of the same material as that of the gate electrode.

4. The device of claim 1, wherein the section contacts the first dummy pattern.

5. A method of fabricating the organic light emitting display of claim 1, the method comprising:
 providing the substrate;
 forming the planarization layer over the substrate;
 forming a first elongate recess in the planarization layer at or near the junction of the pixel region and the non-pixel region such that the first elongate recess extends at least partially along one edge of the pixel region;
 forming a pixel definition layer over the planarization layer such that the pixel definition layer overlies substantially the entire portion of the pixel region while at least partially overlying the non-pixel region;
 forming a second elongate recess in the pixel definition layer over the first elongate recess so as to open the first elongate recess; and
 forming the first dummy pattern, the first dummy pattern being configured to reduce the total depth of the first and second elongate recesses.

6. The method of claim 5, wherein the first dummy pattern is formed over the substrate prior to forming the planarization layer.

7. The method of claim 6, further comprising forming the first insulation layer over the substrate prior to forming the planarization layer, wherein the first dummy pattern is formed on the first insulation layer;

wherein the planarization layer is formed on the first insulation layer such that the first dummy pattern is buried under the planarization layer; and wherein the first elongate recess is formed to at least partially expose the first dummy pattern.

8. The method of claim 7, further comprising, prior to forming the planarization layer, forming the thin film transistor comprising source and drain electrodes over the pixel region of the substrates such that portions of the source and drain electrodes are interposed between the first insulation layer and the planarization layer, wherein the first dummy pattern is simultaneously formed with the source and drain electrodes.

9. The method of claim 8, further comprising, prior to forming the first insulation layer:

forming the second insulation layer over the substrate; and forming the second dummy pattern on the second insulation layer, wherein the first insulation layer is formed over the second insulation layer such that the second dummy pattern is buried under the first insulation layer, and wherein the first dummy pattern substantially overlaps with the second dummy pattern when viewed from over the first dummy pattern.

10. The method of claim 9, wherein forming the thin film transistor comprises forming a gate electrode on the second insulation layer prior to forming the first insulation layer, and wherein the second dummy pattern is formed simultaneously with the gate electrode.

11. The method of claim 6, further comprising forming a third dummy pattern on the first dummy pattern in the first elongate recess so as to further reduce the total depth of the first and second elongate recesses.

12. The method of claim 11, further comprising forming the first pixel electrode on the planarization layer prior to forming the pixel definition layer, wherein the third dummy pattern is simultaneously formed with the first pixel electrode.

13. The method of claim 12, further comprising:

forming the array of openings in the pixel definition layer simultaneously with forming the second elongate recess;

forming the organic light emitting layer in the openings; and forming the second pixel electrode over the pixel definition layer and the organic light emitting layer such that the second pixel electrode extends from over the organic light emitting layer to over the non-pixel region, and such that the second pixel electrode includes a portion that is formed in the first and second elongate recesses.

14. An organic light emitting display device comprising:

a substrate having a pixel region and a non-pixel region adjacent to the pixel region;

a planarization layer formed over the substrate;

a pixel definition structure formed over the planarization layer, the pixel definition structure overlying substantially the entire portion of the pixel region, the pixel definition structure including an array of openings over the pixel region of the substrate;

a plurality of organic light emitting diodes formed in the openings of the pixel definition structure, at least one of the organic light emitting diodes comprising a first pixel electrode formed over the planarization layer, a second pixel electrode overlying the first pixel electrode, and an organic light emitting layer interposed between the first and second pixel electrodes, the second pixel electrode further comprising a portion extending over the non-pixel region;

an elongate recess formed through the planarization layer and the pixel definition structure at or near the junction of the pixel region and the non-pixel region, wherein the portion of the second pixel electrode includes a section that is formed in the elongate recess;

a first dummy pattern formed under the section of the portion of the second pixel electrode; and a third dummy pattern formed on the first dummy pattern in the elongate recess so as to further reduce the depth of the recess.

15. The device of claim 14, wherein the third dummy pattern is formed of the same material as that of the first pixel electrode.

16. An organic light emitting display device comprising:

a substrate having a pixel region and a non-pixel region adjacent to the pixel region;

a planarization layer formed over the substrate;

a pixel definition structure formed over the planarization layer, the pixel definition structure overlying substantially the entire portion of the pixel region, the pixel definition structure including an array of openings over the pixel region of the substrate;

a plurality of organic light emitting diodes formed in the openings of the pixel definition structure, at least one of the organic light emitting diodes comprising a first pixel electrode formed over the planarization layer, a second pixel electrode overlying the first pixel electrode, and an organic light emitting layer interposed between the first and second pixel electrodes, the second pixel electrode further comprising a portion extending over the non-pixel region;

an elongate recess formed through the planarization layer and the pixel definition structure at or near the junction of the pixel region and the non-pixel region, wherein the portion of the second pixel electrode includes a section that is formed in the elongate recess;

a first dummy pattern formed under the section of the portion of the second pixel electrode; and a third dummy pattern formed on the first dummy pattern in the elongate recess so as to further reduce the depth of the recess, wherein the section contacts the third dummy pattern.

* * * * *

UNITED STATES PATENT AND TRADEMARK OFFICE
CERTIFICATE OF CORRECTION

PATENT NO.         : 7,791,267 B2
APPLICATION NO.    : 11/650379
DATED              : September 7, 2010
INVENTOR(S)        : Baek et al.

It is certified that error appears in the above-identified patent and that said Letters Patent is hereby corrected as shown below:

In Column 6, Line 61: change "T1/Al film and a T1/Al/T1" to --Ti/Al film and a Ti/Al/Ti--.

In Column 8, line 58: change "T1/Al film or a T1/Al/T1" to --Ti/Al film or a Ti/Al/Ti--.

Signed and Sealed this
Thirty-first Day of May, 2011

David J. Kappos
*Director of the United States Patent and Trademark Office*